US005873381A

United States Patent [19]

Han

[11] Patent Number: 5,873,381

[45] Date of Patent: Feb. 23, 1999

[54] WET TREATMENT APPARATUS FOR SEMICONDUCTOR WAFER

[75] Inventor: Suk-Bin Han, Chungcheongbuk-do, Rep. of Korea

[73] Assignee: LG Semicon Co., Ltd., Chungcheongbuk-do, Rep. of Korea

[21] Appl. No.: 814,236

[22] Filed: Mar. 11, 1997

[30] Foreign Application Priority Data

Mar. 13, 1996 [KR] Rep. of Korea .................... 1996 6619

[51] Int. Cl.[6] ............................... B08B 3/04; B08B 11/00

[52] U.S. Cl. ........................... 134/182; 134/186; 134/902

[58] Field of Search .................................... 134/902, 182, 134/186

[56] References Cited

U.S. PATENT DOCUMENTS

| | | | |
|---|---|---|---|
| 3,937,236 | 2/1976 | Runnells | 134/182 X |
| 3,950,184 | 4/1976 | Adams et al. | 134/902 X |
| 4,955,402 | 9/1990 | Miranda | 134/186 X |
| 5,370,142 | 12/1994 | Nishi et al. | 134/902 X |

FOREIGN PATENT DOCUMENTS

| | | | |
|---|---|---|---|
| 0273628 | 7/1988 | European Pat. Off. | 134/902 |
| 61632 | 4/1983 | Japan | 134/902 |

OTHER PUBLICATIONS

24th Symposium on ULSI Ultra Clean Technology, p. 94.

*Primary Examiner*—Philip R. Coe

[57] ABSTRACT

A wet treatment device for bathing a semiconductor wafer in a processing solution is disclosed. The device includes a processing tank, a discharge ditch around the processing tank, a flow control board located in the processing tank, a supply line supplying processing solution to the processing tank, and a discharge line carrying away processing solution from the discharge ditch. Any two walls in the device are connected in a curved surface having an arc sufficient to reduce accumulation of contaminant matter at the curved surface. A line connects to a wall in a curved annular surface any two walls having an arc sufficient to reduce abrasion at the curved annular surface. The curved surface can be substituted with an approximation of a curved surface so long as the approximation has an arc sufficient to reduce accumulation/abrasion.

16 Claims, 8 Drawing Sheets

WET TREATMENT APPARATUS FOR SEMICONDUCTOR WAFER

FIELD OF THE INVENTION

The present invention relates to a wet treatment apparatus for a semiconductor wafer, and more particularly, to a wet treatment apparatus for a semiconductor wafer, which is used for a wet treatment such as cleaning of a wafer during the fabrication of a semiconductor device.

BACKGROUND OF THE INVENTION

In the fabrication of a semiconductor device, the cleaning technique of a semiconductor wafer becomes important. A conventional wet treatment apparatus for the semiconductor wafer, used for cleaning the semiconductor wafer, has employed an overflowing method. The wafer is introduced into a processing tank constructed in a manner that a processing solution (such as cleaning water) is introduced from its bottom and the level thereof raised until the wafer is submerged to thereby wet-treat the wafer.

FIG. 1 is a perspective view showing a conventional wet treatment apparatus for a semiconductor wafer, FIG. 2 is a cross-sectional view taken along line A–A' of FIG. 1, and FIG. 3 is a cross-sectional view taken along line B–B' of FIG. 1. As shown in FIGS. 1, 2 and 3, the conventional apparatus includes a processing tank 11 constructed in a manner that a processing solution supply line 12 is connected to its bottom 11-1, to supply a processing solution (such as cleaning water or a cleaning solution) into the processing tank 11, and the supplied processing solution overflows its side wall 11-2. The semiconductor wafer 10 is introduced into processing tank 11.

Generally, a plurality of semiconductor wafers 10 are carried in a wafer carrier 15 and introduced into the processing tank 11. A discharge ditch 14 is formed around side wall 11-2 of the processing tank 11, and its bottom is connected to a discharge line 13. Discharge line 13 is connected to processing solution supply line 12 through a pump 16 and filter 17, to purify the discharged processing solution through filter 17. By doing so, the discharged processing solution is recirculated.

There is a conventional wet treatment apparatus having a structure in which its discharge line and supply line are not connected to each other, and the processing solution discharged from the discharge line is discarded. This apparatus is used in case that the processing solution which passes through its processing tank is severely contaminated.

Reference numeral 18 designates a flow control board in which holes are formed, probably formed uniformly, to make the processing solution flow into each portion of processing tank 11. Accordingly, when wafer carrier 15 containing the plurality of wafers 10 is introduced into the conventional processing tank 11, the processing solution (such as cleaning water) supplied through supply line 12 flows inside processing tank 11, to wet-treat the wafer. Then, the processing solution overflows side wall 11-2 of the processing tank 11, to be introduced into the discharge ditch. The processing solution introduced into discharge ditch 14 is discharged through discharge line 13, to be recirculated through filter 17 by the pump 16.

The aforementioned conventional apparatus is disclosed on page 94 of the publication entitled, "24th Symposium on ULSI Ultra Clean Technology," Japan, Mar. 7–8, 1995, and in U.S. Pat. No. 5,370,142.

As shown in FIGS. 1, 2 and 3, in the conventional apparatus, the inner sides of processing tank side walls 11-2 make a right angle with each other, or the inner side of side wall 11-2 and inner side of bottom 11-1 meet at right angles to form a corner portion. By doing so, contamination material (such as particles or residue) is stuck in the corner, and serves as a contamination source. This contaminates the processing solution and wafer.

As shown in FIG. 3, in the above-described conventional apparatus, sharp protrusion portions 19*a* and 19*b* are formed on portions where processing tank 11 and processing solution supply line 12 meet, and discharge ditch 14 and discharge line 13 meet. Abrasion, due to the processing solution flowing past, occurs at these points of protrusion, increasing the generation of contamination material in the processing tank 11. In case that the processing solution is purified through filter 17 to be recirculated, the increase of contamination material in the processing tank 11 reduces the durability of filter 17.

SUMMARY OF THE INVENTION

It is an object of the present invention to provide a wet treatment apparatus for a semiconductor wafer, capable of reducing the contamination of the wafer during wet treatment of the semiconductor wafer by reducing the accumulation of contaminant and the abrasion of line connections.

To accomplish the object of the present invention, there is provided a wet treatment apparatus for a semiconductor wafer, into which a semiconductor wafer is introduced and treated, the apparatus including a processing solution supply line and a processing tank. The processing tank is constructed in a manner that at a bottom thereof where connected to the processing solution supply line, at portions where inner sides of the side walls of the processing tank meet with each other, and at portions where the inner sides of the side walls and an inner side of the bottom meet, there is a curved surface. A top surface of the processing tank is open such that the processing solution from the processing solution supply line can overflow the processing tank. A discharge ditch is formed around the side walls of the processing tank, and a discharge line connected to a bottom of the discharge ditch.

The objects of the present invention are also fulfilled by providing a wet treatment device for bathing a semiconductor wafer in a processing solution. Such a device of the present invention includes a processing tank having side walls, a bottom wall and first joining portions. Each first joining portion connects two walls of the processing tank in a curved surface. The device also includes a flow control board located within the processing tank. The processing tank has second joining portions, each connecting a wall of the processing tank to the flow control board in a curved surface. A supply line for supplying processing solution is connected to the processing tank by a third joining portion connecting a wall of the processing tank to the supply line in a curved annular surface. The supply line includes at least one joining section connecting adjacent straight sections of the supply line in a curved annular surface.

The wet treatment device of the present invention further includes a discharge ditch, formed around the sidewalls of the processing tank, having outer walls and a bottom wall. The side walls of the processing tank form inner walls of the discharge ditch. Third joining portions of the processing tank connect a side wall of the processing tank to the bottom wall of the discharge ditch in a curved surface, an arc of the third approximation being sufficient to reduce accumulation of contaminant matter at the third joining portion. Fourth joining portions connecting any two walls of the discharge ditch in a curved surface.

The arcs of the curved surfaces and the curved annular surfaces of the wet treatment device of the present invention are sufficient to reduce accumulation of contaminant matter at the joining portions/sections. Where a joining portion connects a line to a wall, the arc of the curved annular surface is sufficient to reduce abrasion at the joining portion. The curved surfaces and curved annular surfaces can be substituted with an approximation of a curved surface so long as the approximation has an arc sufficient to reduce accumulation or abrasion, respectively.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF THE PREFERRED EMBODIMENTS

Figure 1:
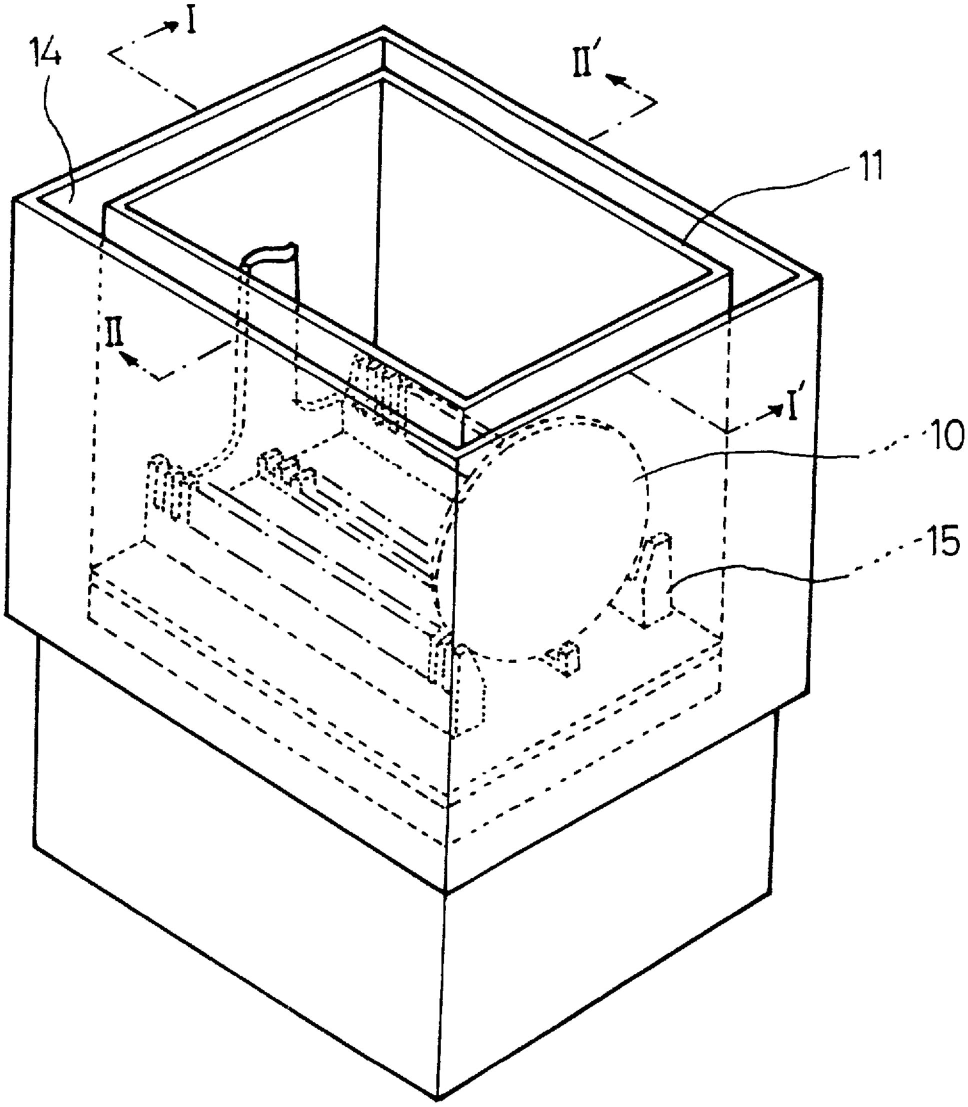
FIG. 1 is a perspective view of a conventional wet treatment apparatus for a semiconductor wafer.
Figure 2:
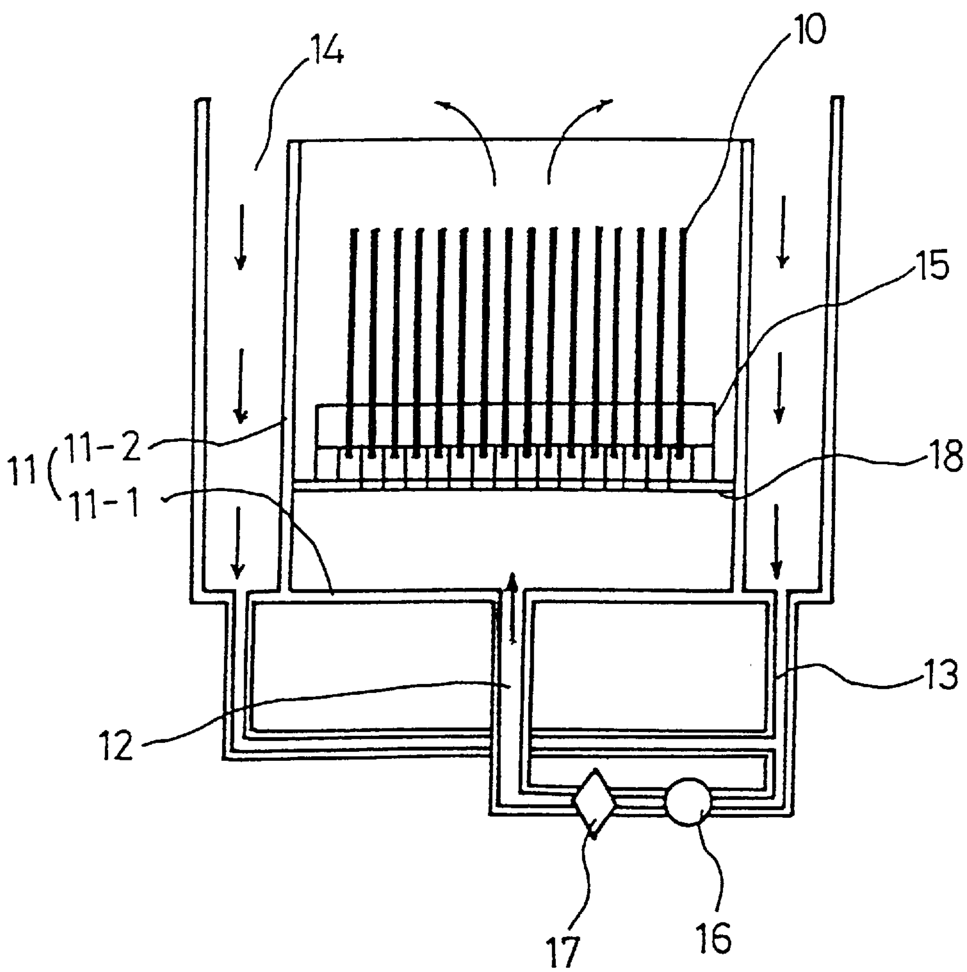
FIG. 2 is a cross-sectional view taken along line A–A' of FIG. 1.
Figure 3A:
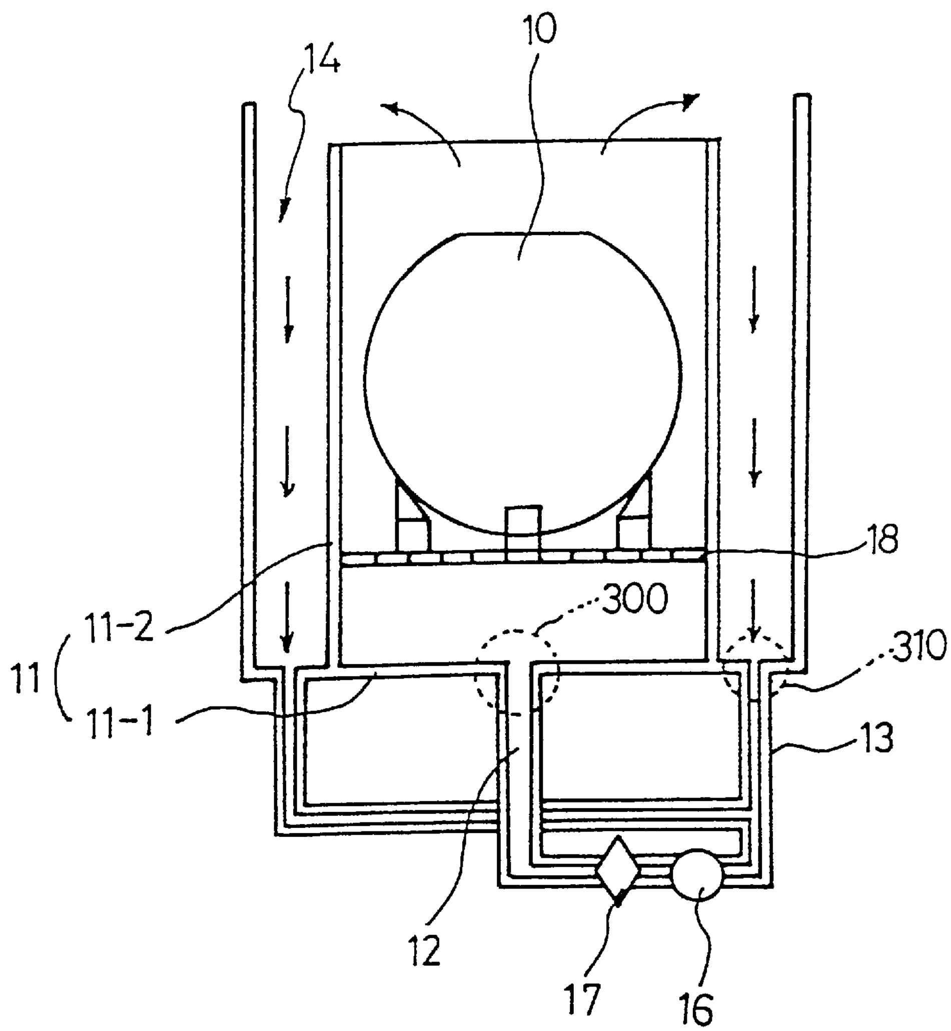
FIG. 3 is a cross-sectional view taken along line B–B' of FIG. 1.
Figure 3B:
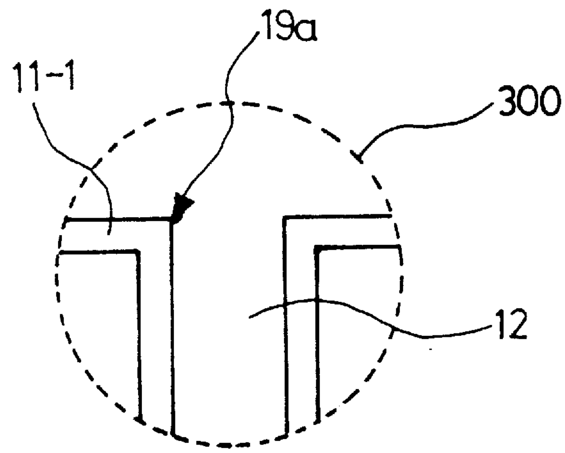
Figure 3C:
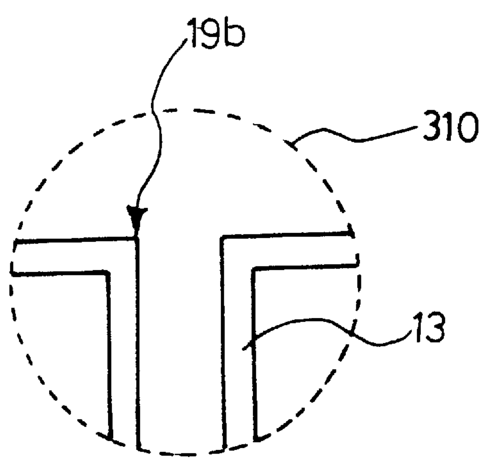
Figure 4:
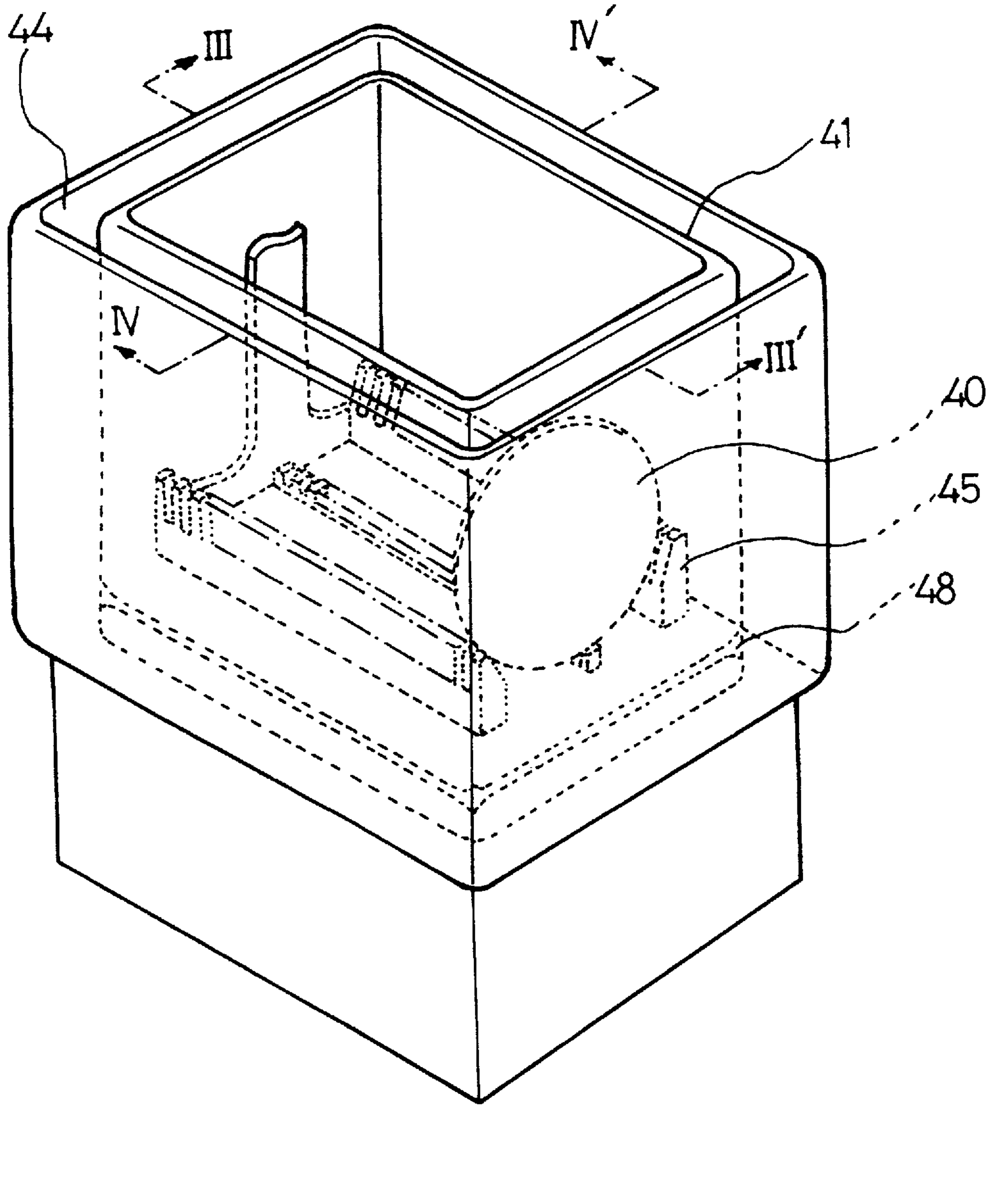
FIG. 4 is a perspective view showing a wet treatment apparatus for a semiconductor wafer according to an embodiment of the present invention.
Figure 5:
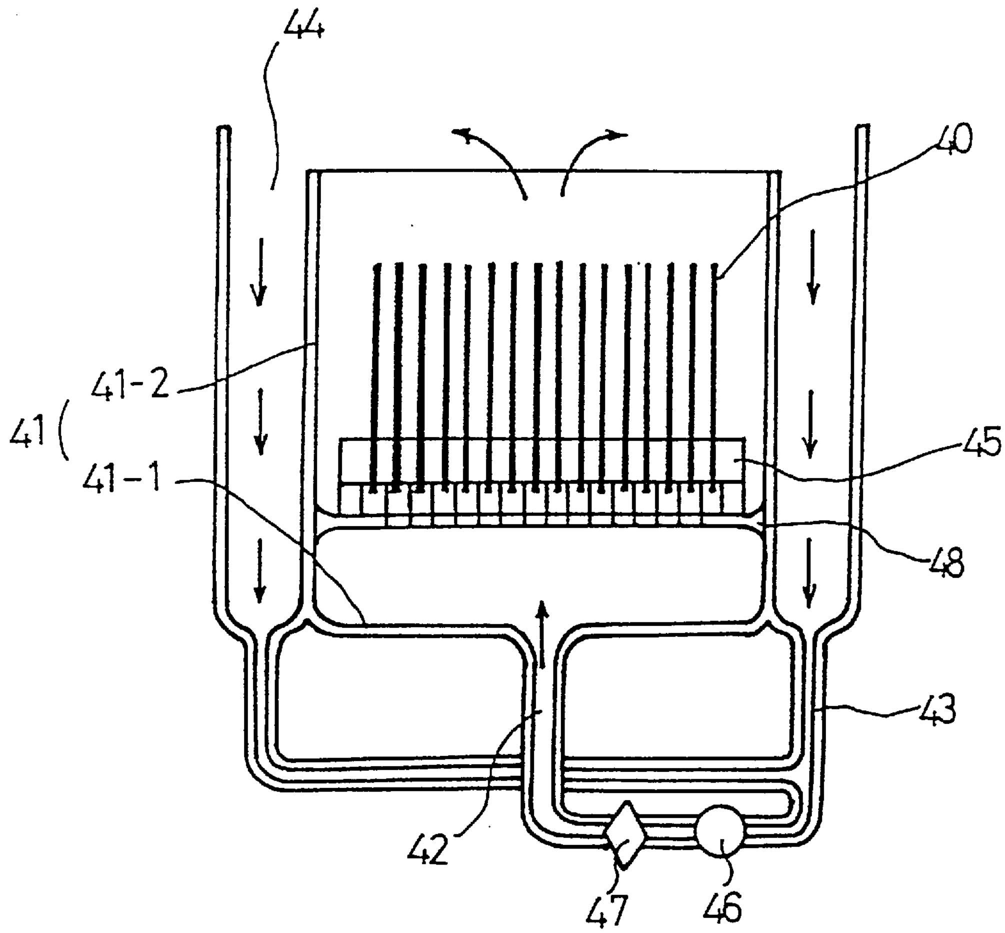
FIG. 5 is a cross-sectional view taken along line C–C' of FIG. 4.
Figure 6A:
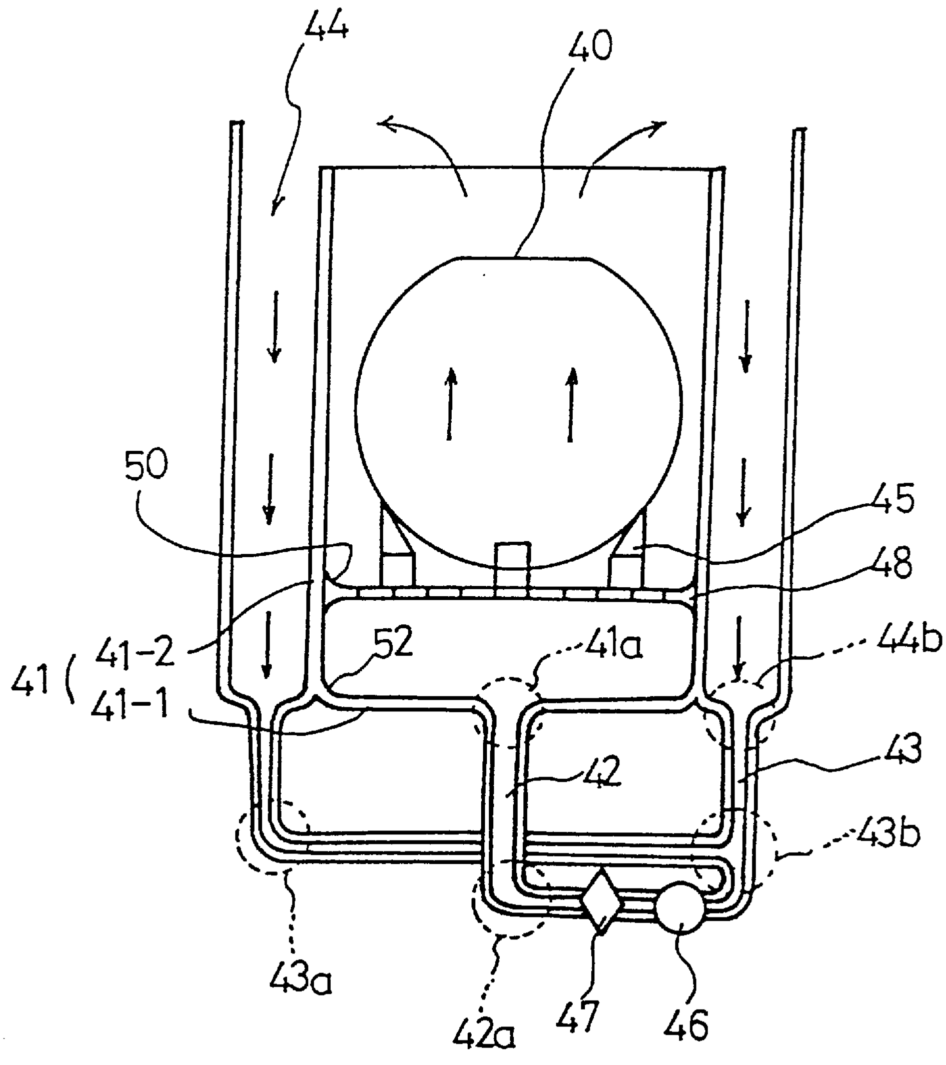
FIG. 6 is a cross-sectional view taken along line D–D' of FIG. 4.
Figure 6B:
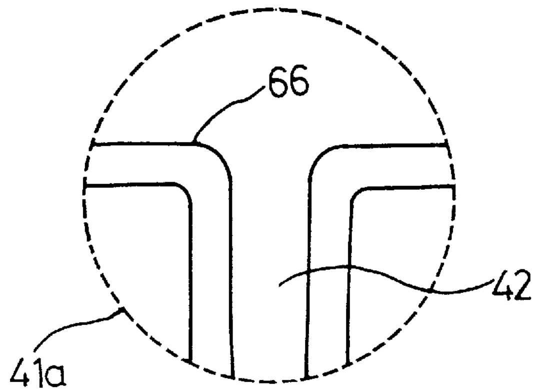
Figure 6C:
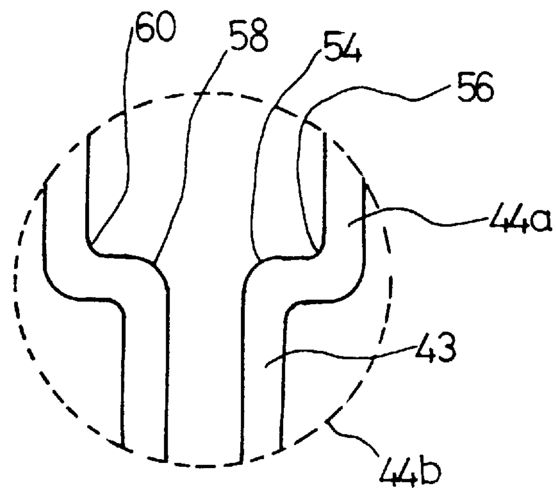
Figure 6D:
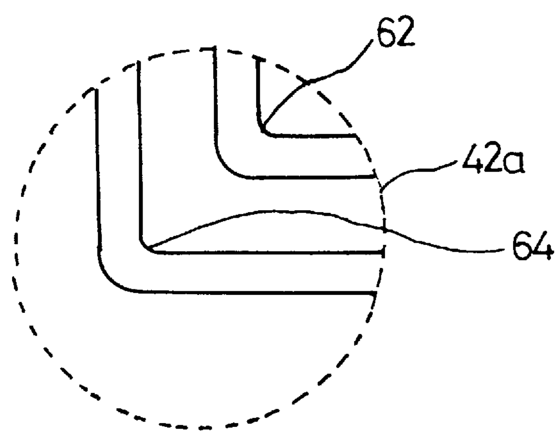

A preferred embodiment of the present invention will be explained below with reference to the accompanying drawings. FIG. 4 is a perspective view showing a wet treatment apparatus for a semiconductor wafer according to an embodiment of the present invention. FIG. 5 is a cross-sectional view taken along line C–C' of FIG. 4. FIG. 6 is a cross-sectional view taken along line D–D' of FIG. 4.

As shown in FIGS. 4, 5 and 6, the wet treatment apparatus of the present invention includes a processing tank 41 constructed in a manner that a portion where the inner sides of its side walls 41-2 meet with each other preferably makes a curved surface, a portion where the inner side of its side wall 41-2 and its bottom 41-1 meet also preferably make a curved surface, and its top surface is open.

Bottom 41-1 of the processing tank 41 is connected to a processing solution supply line 42 for supplying processing solution (such as cleaning wafer or cleaning solution), and their connection portion preferably makes a curved surface. For the purpose of forming this curved surface, a portion of processing solution supply line 42 connected to the processing tank is formed in the shape of funnel whose inner side is curved. Otherwise, a protruded open portion whose inner side is curved is formed on the connection portion of bottom 41-1 of the processing tank, to insert supply line 42 thereinto. Since the inner side of the connection portion has a curved shape, it is possible to prevent the connection portion from being abraded, especially, to prevent it from being abraded due to the processing solution flowing past it.

A discharge ditch 44 is formed around side wall 41-2 of the processing tank. A portion where the inner sides of the side walls of discharge ditch 44 meet with each other preferably makes a curved surface, and a portion where the inner side of its side wall and its bottom meet also preferably makes a curved surface. A discharge line 43 is connected to the bottom of discharge ditch 44, similar to the manner in which processing tank 41 is connected to processing solution supply line 42.

Reference numeral 46 designates a pump, and 47 filter. They are used for purifying the discharged processing solution. Reference numeral 48 designates a flow control board in which holes are formed in uniform distribution. This flow control board makes the processing solution uniformly flow to each portion of the processing tank uniformly. A portion where the flowing direction of the processing solution or the speed of its current in supply line 42 and discharge line 43 are changed, that is, a bent portion, e.g., 42*a*, 43*a* and 43*b* (shown in FIG. 6) of lines 42 and 43, is formed preferably in a curved shape. By doing so, the bent portion is prevented from being abraded. The bent portion 43*b* is depicted as a T-connection, but could also be a Y-connection.

To reiterate, the present invention eliminates the substantially right-angled corner portions found in the conventional art wet treatment devices. Reconsidering FIG. 6, the sidewall 41-2 intersects the flow control board 48 at the curved portions 50 (only one of which is identified in FIG. 6, for simplicity). The sidewall 41-2 intersects the bottom 41-1 at the curved portions 52 (only one of which is identified, for simplicity). The discharge ditch 44, formed from the sidewall 41-1 and the outer wall 44-*a*, intersects with the discharge line 43 at the regions 44*b*. Each region 44*b* includes the curved portions 55, 56, 58 and 60. The bent portion 42*a* of the supply line 42 includes the curved portions 62 and 64. The bottom 41-1 intersects with the supply line 42 at the region 41*a*. The region 41*a* includes the curved portions 66, only one of which has been identified, for simplicity. The bent region 43*a* has curved portion similar to those of the bent region 42*a*. The discharge line 43 has at least two branches that meet at the region 43*b*, which has curved surfaces similar to those found in the region 41*a*. The curved portions explicitly identified above are exemplary of the numerous curved portions in FIGS. 4–6 that are consistent with the present invention. Further identification of particular curved surfaces is unnecessary.

It is known that a curve can be approximated by a sequence of short straight line segments. Alternatively, the curved portions of the present invention (that replace the substantially right-angled corner portions of the conventional art) can be approximated using a sequence of small flat surfaces that define a contour which approximates a curve. The corner portions of the conventional art are characterized by a substantially 90° angle of intersection. So long as the small flat surfaces intersect at angles comparable to the degree of curvature of the curved portions of the present invention, comparable advantages should be obtained.

Accordingly, in the wet treatment apparatus of the present invention, when wafer carrier 45 carrying the plurality of wafers 40 is introduced into processing tank 41, the processing solution (such as cleaning water supplied through supply line 42) flows into the processing tank 41, to wet treat the wafer. Then, the processing solution overflows side wall 41-2 of the processing tank, into discharge ditch 44. The processing solution introduced into discharge ditch 44 is discharged through discharge line 43, to be recirculated through filter 47 by pump 46.

As described above, according to the present invention, a portion where the inner sides of the processing tank side walls 41-2 meet with each other, and a portion where the inner side of the processing tank side wall and its bottom meet are curved in shape (or define a contour approximating a curved shape), so that a substantially right-angled corner portion (in which a contamination source accumulates in the conventional apparatus) of the conventional art is not created. This reduces the contamination of the processing solution and semiconductor wafer, resulting in improvement of the cleaning effect. Also, the connection portion of the processing tank and processing solution supply line, the connection portion of the discharge ditch and discharge line, the supply line, and discharge line are similarly formed in a curved shape or an approximation thereof to reduce their abrasion. By doing so, it is possible to decrease the generation of the contaminant material during wet treatment of the semiconductor wafer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wet treatment apparatus for a semiconductor wafer, into which a semiconductor wafer is introduced and treated, said apparatus comprising:

a processing solution supply line;

a processing tank constructed in a manner that a bottom thereof where connected to said processing solution supply line, portions where inner sides of the side walls of said processing tank meet with each other, and portions where the inner sides of the side walls and an inner side of said bottom meet, make a curved surface, and a top surface of said processing tank being open such that said processing solution from said processing solution supply line can overflow said processing tank;

a discharge ditch formed around the side walls of said processing tank; and a discharge line connected to a bottom of said discharge ditch;

wherein portions of said apparatus where inner side walls of said discharge ditch meet with each other and where said inner side walls of said discharge ditch and inner side of the bottom of said discharge ditch meet make a curved surface.

2. The wet treatment apparatus for a semiconductor wafer as claimed in claim 1, wherein a portion where an inner side of said processing solution supply line and an inner side of said processing tank meet, makes a curved surface.

3. The wet treatment apparatus for a semiconductor wafer as claimed in claim 2, wherein outer walls of said processing tank form some of said walls of said discharge ditch.

4. The wet treatment apparatus for a semiconductor wafer as claimed in claim 2, wherein a portion where an inner side of said discharge line and the inner side of a wall of said discharge ditch meet, makes a curved surface.

5. The wet treatment apparatus for a semiconductor wafer as claimed in claim 2, wherein a portion of said processing solution supply line and said discharge line, at which speed of a current of said processing solution and its flowing direction are changed, is formed in a shape of a curve.

6. A wet treatment apparatus for bathing a semiconductor wafer in a processing solution, the apparatus comprising:

a processing tank having side walls and a bottom wall;

said processing tank having first joining portions, each first joining portion connecting two walls of said processing tank in at least a first approximation of a curved surface, an arc of said first approximation being sufficient to reduce accumulation of contaminant matter at said first joining portion; and a flow control board located within said processing tank;

said processing tank having second joining portions, each second joining portion connecting a wall of said processing tank to said flow control board in at least a second approximation of a curved surface, an arc of said second approximation being sufficient to reduce accumulation of contaminant matter at said second joining portion.

7. The apparatus as in claim 6, further comprising:

a supply line for supplying processing solution;

said processing tank having a third joining portion connecting a wall of said processing tank to said supply line in at least a third approximation of a curved annular surface, an arc of said third approximation being sufficient to reduce abrasion of said third joining portion.

8. The apparatus as in claim 7, wherein said third joining portion is located in said bottom wall of said processing tank.

9. The apparatus as in claim 7, wherein said supply line includes at least one joining section connecting adjacent straight sections of said supply line in at least a fourth approximation of a curved annular surface, an arc of said fourth approximation being sufficient to reduce abrasion of said joining section.

10. The apparatus as in claim 9, wherein each of said joining portions and said at least one joining sections connects, respectively, in a curved surface.

11. The apparatus as in claim 6, further comprising:

a discharge ditch formed around said sidewalls of said processing tank, said discharge ditch having outer walls, a bottom wall, said side walls of said processing tank forming inner walls of said discharge ditch;

said processing tank having third joining portions, each third joining portion connecting a side wall of said processing tank to said bottom wall of said discharge ditch in at least a third approximation of a curved surface, an arc of said third approximation being sufficient to reduce accumulation of contaminant matter at said third joining portion;

said discharge ditch having fourth joining portions, each fourth joining portion connecting any two walls of said discharge ditch in at least a fourth approximation of a curved surface, an arc of said fourth approximation being sufficient to reduce accumulation of contaminant matter at said fourth joining portion.

12. The apparatus as in claim 11, further comprising:

a discharge line;

said discharge ditch having a fifth joining portion connecting a wall of said discharge tank to said processing solution supply line in at least a fifth approximation of a curved annular surface, an arc of said fifth approximation being sufficient to reduce abrasion of said fifth joining portion.

13. The apparatus as in claim 12, wherein said fifth joining portion is located in said bottom wall of said discharge ditch.

14. The apparatus as in claim 12, wherein said discharge line has a plurality of branches, and said discharge line including at least one joining section for one of T-connecting and Y-connecting straight sections of two branches, respectively, in at least a sixth approximation of a curved annular surface, an arc of said sixth approximation being sufficient to reduce abrasion at said joining section.

15. The apparatus as in claim 14, wherein each of said joining portions and said at least one joining sections connects, respectively, in a curved surface.

16. The apparatus as in claim 6, wherein said first joining portions connect, respectively, in a curved surface.

* * * * *